United States Patent [19]  [11] Patent Number: 5,043,776
Hida  [45] Date of Patent: Aug. 27, 1991

[54] SEMICONDUCTOR DEVICE HAVING COMPOUND SEMICONDUCTOR FET OF E/D STRUCTURE WITH HIGH MARGIN

[75] Inventor: Hikaru Hida, Tokyo, Japan

[73] Assignee: NEC Corporation, Tokyo, Japan

[21] Appl. No.: 608,039

[22] Filed: Nov. 2, 1990

Related U.S. Application Data

[63] Continuation of Ser. No. 372,720, Jun. 28, 1989, abandoned.

[30] Foreign Application Priority Data

Jun. 28, 1988 [JP] Japan ............................ 63-161511
Jun. 28, 1988 [JP] Japan ............................ 63-161512

[51] Int. Cl.$^5$ .......................................... H01L 29/80
[52] U.S. Cl. ...................................... 357/22; 357/16; 357/4; 357/56
[58] Field of Search ............... 357/22 A, 22 D, 22 I, 357/22 G, 22 J, 22 MD, 16, 23.12, 4, 56, 58

[56] References Cited

U.S. PATENT DOCUMENTS

| 4,605,945 | 8/1986 | Katayama et al. | 357/22 A |
| 4,636,822 | 1/1987 | Codella et al. | 357/22 I |
| 4,733,283 | 3/1988 | Kuroda | 357/22 A |
| 4,742,379 | 5/1988 | Yamashita et al. | 357/16 |
| 4,771,324 | 9/1988 | Odani et al. | 357/22 A |

FOREIGN PATENT DOCUMENTS

| 58-147078 | 9/1983 | Japan | 357/22 MD |
| 59-72774 | 4/1984 | Japan | 357/22 G |
| 60-136381 | 7/1985 | Japan | 357/22 MD |
| 61-96769 | 5/1986 | Japan | 357/22 MD |
| 61-168965 | 7/1986 | Japan | 357/22 MD |
| 62-73674 | 4/1987 | Japan | 357/22 MD |
| 209866 | 9/1987 | Japan | 357/22 MD |
| 248263 | 10/1987 | Japan | 357/22 MD |
| 274782 | 11/1987 | Japan | 357/22 MD |
| 63-37670 | 2/1988 | Japan | 357/22 A |
| 63-111673 | 5/1988 | Japan | 357/22 MD |

OTHER PUBLICATIONS

New Device Structure for 4Kb HEMT SRAM, S. Kuroda, et al., GaAs IC Symposium, pp. 125-128, (1984).
A New Low-Noise AlGaAs/GaAs 2DEG FET with a Surface Undoped Layer, Hikaru Hida, et al., reprinted from IEEE Transactions on Electron Devices, vol. ED-33, No. 5, May 1986; pp. 601-607.

Primary Examiner—Rolf Hille
Assistant Examiner—Minhloan Tran
Attorney, Agent, or Firm—Burns, Doane, Swecker & Mathis

[57] ABSTRACT

The semiconductor device of the present invention includes on one and the same substrate a first transistor having a first semiconductor layer with high-impurity density on which is provided a second semiconductor layer with low-impurity density, where the first semiconductor layer being of N type and having electron affinity greater than that of the second semiconductor layer, and is equipped with a control electrode provided on the second semiconductor layer and at least two ohmic electrodes that are electrically connected to the first semiconductor layer on both sides of the control electrode, and a second transistor having a third semiconductor layer with low-impurity density provided on top of the second semiconductor layer on the first semiconductor layer, and is equipped with a control electrode provided on the third semiconductor layer and at least two ohmic electrodes that are electrically connected to the first semiconductor layer on both sides of the control electrode. Further, by setting the first semiconductor layer to be a P-type semiconductor having the sum of the electron affinity and the energy gap smaller than the sum of the electron affinity and the energy gap of the second semiconductor layer, there can be obtained a semiconductor using holes as carriers.

56 Claims, 3 Drawing Sheets

SEMICONDUCTOR DEVICE HAVING COMPOUND SEMICONDUCTOR FET OF E/D STRUCTURE WITH HIGH MARGIN

This application is a continuation of application Ser. No. 07/372,720, filed June 28, 1989, now abandoned.

BACKGROUND OF THE INVENTION

1. Field of the Invention

The present invention relates to a semiconductor device, and more particularly to a semiconductor device having a compound semiconductor field-effect transistor (FET) of E/D structure which can realize a direct coupled EFT logic (DCFL) circuit with a high noise margin.

2. Description of the Related Art

In recent years, research and development on integrated circuits using compound semiconductor such as GaAs is being pursued vigorously with a view to increasing the speed of operation. In this connection it has generally been recognized that the so-called DCFL with E/D structure which is constituted by enhancement-mode FETs (E-FETs) and depletion-mode FETs (D-FETs) has low power consumption so that it is suited for increasing the level of integration, and moreover, has a high speed of operation. In fact, research and development is being engaged actively attempting to realize a DCFL circuit by the use of GaAs MESFETs. However, the conventional GaAs MESFET has a relatively low Schottky barrier height of about 0.75 V so that there has been a problem that it is not possible in reality to secure a sufficient operational noise margin of the circuit. In addition, because of the dispersion in the threshold voltage due to the use of ion implantation in forming E-FETs and D-FETs, there has been a problem that a sufficient operational noise margin of the circuit cannot be secured either.

On the other hand, investigation of DCFL circuits using E type and D type high electron mobility transistors is also being pursued (see, for example, Technical Digest of GaAs IC Symposium, 1984, p. 125). However, in realizing a DCFL circuit of E/D structure by the use of high electron mobility transistors, it is usual to vary the film thickness of the n-type semiconductor layer with doped impurities, and further, selective crystal etching is required twice because of its recessed gate structure, so that there is a problem that the element characteristics tend to have a dispersion under the influence of the manufacturing processes. Further, in a DCFL circuit, in spite of a need for a large operational noise margin, the high electron mobility transistor has, due to its intrinsic structure, a semiconductor layer with doped impurities situated immediately beneath the gate electrode, so that it is essentially impossible to increase the forward breakdown voltage $V_f$ of the gate, which makes an improvement of the noise margin difficult to achieve. Moreover, in the manufacturing method disclosed in the above-mentioned reference, dry etching for semiconductor layer is given after the gate part is opened, so that it is difficult to set dry etching conditions which satisfy simultaneously control of the width of the gate opening and protection against its damage. This is due to the circumstance that when an anisotropic treatment (here it is a vertical treatment) is attempted in order, for example, to restrain the width of the gate opening to a possible minimum and to suppress an increase in the parasitic resistance, it becomes necessary to intensify ionic etching which tends to give damages to the surface to be etched. Conversely, in order to suppress damages it becomes necessary to utilize reactive treatment by radicals instead of the ionic treatment in which case the treatment involved is of isotropic so that the width of the gate opening becomes increased and reduction of the parasitic resistance becomes difficult.

SUMMARY OF THE INVENTION

It is, therefore, an object of the present invention to provide a semiconductor device having a compound semiconductor FET of E/D structure which is high speed and possesses a large noise margin, and a manufacturing method thereof.

The semiconductor device of the present invention is formed by providing on one and the same substrate a first transistor having a first semiconductor layer with high-impurity density on which is provided a second semiconductor layer with low impurity density, where the first semiconductor layer being of N type and having electron affinity greater than that of the second semiconductor layer, and is equipped with a control electrode provided on the second semiconductor layer and at least two ohmic electrodes that are electrically connected to the first semiconductor layer on both sides of the control electrode, and a second transistor having a third layer with low-impurity density provided on top of the second semiconductor layer on the first semiconductor layer, and is equipped with a control electrode provided on the third semiconductor layer and at least two ohmic electrodes that are electrically connected to the first semiconductor layer on both sides of the control electrode.

Further, by choosing the first semiconductor layer to be a P-type semiconductor layer having the sum of the electron affinity and the energy gap which is smaller than the sum of the electron affinity and the gap energy of the second semiconductor layer, there can be obtained a semiconductor device that has holes as carriers.

In addition, by providing a fourth semiconductor layer of the same conductivity type as that of the first semiconductor layer between the third and the second semiconductor layer with low-impurity densities, characteristics of the element will further be improved.

The semiconductor device in the above can be fabricated by the process of sequential crystal growth of the first semiconductor layer, the second semiconductor layer and the third semiconductor layer on the semiconductor substrate, the step of selectively removing the third semiconductor layer, and the step of forming the first transistor on the second semiconductor layer in the removed portion, and forming the second transistor on the third semiconductor layer which is the portion what is left when the removed portion is taken away.

The fundamental transistor in the semiconductor device of the present invention includes a heterojunction between the control electrode and the channel and the semiconductor material directly below the control electrode has high resistance as a rule, as disclosed in Japanese Patent Laid Open, No. 62-209866, Japanese Patent Laid Open, No. 62-248263 and Japanese Patent Laid Open No. 62-274783, so that it is possible to have both of the depletion layer modulation mode and the charge accumulation mode as its operational modes. Accordingly, the channel charge quantity that is controllable can be made large, the current driving capability can be improved, and is possible as a result to increase the speed of the element. Further, the voltage ($V_r$) at which the current between the control electrode and the ohmic electrode rises is high, and hence, the apparent Schottky barrier becomes high, so that the operational noise margin, for example, of an integrated circuit using a DCFL circuit can be increased. Moreover, since the channel aspect ratio can be chosen large, it is possible to suppress the short-channel effect, and can readily realize a high-performance short-channel element. The semiconductor device of the present invention makes use of controllability of current threshold voltage of the element by adjusting in principle the film thickness of the high-resistance semiconductor layer in the surface of the element, so that it is possible, for example, to give action and effects which are intrinsic to the integration of enhancement mode and depletion mode element. In this case, the semiconductor layer whose thickness is to be adjusted is a high resistance semiconductor layer undoped with impurities, different from a high electron mobility transistor, variations in the current due to threshold voltage can be reduced substantially even for the variations in the surface film thickness that occur during various processes. In addition, in the case of E/D structure, it is possible to substantially increase the transconductance of the D-FETs by adding impurities in part of the surface on the D-FET side. Further, since it becomes possible in this case to increase the degree of freedom of independent control of the current threshold voltage of the D-FET, and the forward rising voltage $V_r$ of the gate is different for the E-FET and the D-FET, it becomes possible to realize two kinds of level shift diodes, enabling to expand the degree of freedom in circuit design.

Further, in the manufacturing method of the present invention, use is made of epitaxially grown crystals with high uniformity, and the third semiconductor layer is selectively removed, so that the nonuniformity in the threshold voltage of the voltage is small. In particular, in the case of using dry etching, it is possible to select etching conditions by means of radicals that give low damages so that deterioration of the element characteristics can be suppressed while maintaining the high uniformity. Consequently, even in the case of forming a DCFL circuit of E/D structure, for example, it is possible to obtain a high-performance semiconductor device with high operational noise margin of the circuit.

In addition, the method of improving the breakdown voltage of the high electron mobility transistor by the insertion of an undoped semiconductor layer in the surface is disclosed in H. Hida et al., IEEE Trans. Electron Devices, Vol. ED-33, No. 5, p. 601 (1986).

Further, the semiconductor device of the present invention is constructed by a first transistor equipped with either an N-type first semiconductor layer with high-impurity density, a low-impurity density second semiconductor layer and a low-impurity density third semiconductor layer sequentially formed, where the electron affinity of the first semiconductor layer is greater than that of the second semiconductor layer, and a control layer formed on the third semiconductor layer, or a high-impurity density first semiconductor layer, a low-impurity density second semiconductor layer, a low-impurity density third semiconductor layer and a low-impurity density fourth semiconductor layer sequentially formed, and a control electrode formed on the fourth semiconductor layer, and with at least two ohmic electrodes on both sides of the control electrode connected electrically to the first semiconductor layer, and a second transistor equipped with a fourth semiconductor layer and a fifth semiconductor layer formed on the third semiconductor layer, and with at least two ohmic electrodes on both sides of the control electrode connected electrically to the first semiconductor layer, where the first transistor and the second transistor being provided on the same substrate, and the fourth and the fifth semiconductor layers being chosen to be low-impurity density.

Moreover, by chosing the first semiconductor layer to be a P-type semiconductor layer having the sum of electron affinity and energy gap which is smaller than the sum of electron affinity and energy gap of the second semiconductor layers, there can be obtained a semiconductor device with positive holes as carriers.

If an impurity with the same conductivity type as that of the first semiconductor layer is added in a part of the fourth and the fifth low-impurity density semiconductor layer, then a more satisfactory effect can be obtained.

Further, by selecting the fourth semiconductor layer to be a semiconductor having a larger energy gap than that of the second semiconductor layer, an element with high performance can be obtained.

The above-mentioned semiconductor integrated device can be manufactured by the process of sequentially growing crystals for the first through the fifth semiconductor layers on the substrate, the process of selectively removing the fifth semiconductor layer and the process of forming the first transistor on the fourth semiconductor layer in the removed part and forming the second transistor on the fifth semiconductor layer in the part other than the removed part.

As an alternative method of manufacturing the integrated device, use may be made of the process of sequentially growing crystals for the first through the fifth semiconductor layers, the process of selectively removing the fifth semiconductor layer and further removing the fourth semiconductor layer and the process of forming the first transistor on the third semiconductor layer in the removed part and forming the second transistor on the fifth semiconductor layer in the portion other than the removed part.

In the present semiconductor device, in order to further raise the forward rise voltage $V_r$ of the gate, it needs to set the energy gap of the fourth semiconductor layer to be greater than that of the second semiconductor layer. Further, in the above method of manufacture, the fifth semiconductor layer is removed selectively so that nonuniformity of the threshold voltage of the semiconductor device is small.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

First Embodiment

Figure 1:
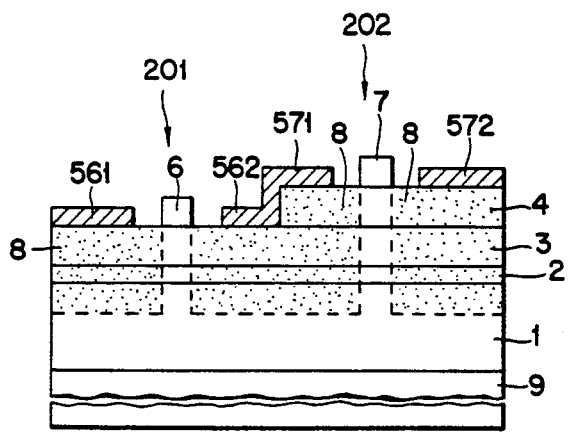
FIG. 1 is a sectional view of the structure of the important parts of a first embodiment of the semiconductor integrated device of the present invention.

Referring to FIG. 1, an undoped GaAs layer 1 with thickness of 5000 Å is provided on a semi-insulating substrate 9, an N-type GaAs layer 2 with thickness of 100 Å with high-impurity density of $2 \times 10^{18}$ cm$^{-3}$ is provided on the GaAs layer and an undoped Al$_{0.3}$Ga$_{0.7}$As layer 3 with thickness of 250 Å is provided on the GaAs layer 2. On the Al$_{0.3}$Ga$_{0.7}$As layer 3 on the right-hand side, there is provided an undoped GaAs layer 4 with thickness of 250 Å.

On the Al$_{0.3}$Ga$_{0.7}$As layer 3 on the left-hand side and on the GaAs layer 4 on the right-hand side, there are provided control electrodes consisting of WSi 6 and 7, respectively. On both sides of the respective control electrodes 6 and 7 high-impurity density regions 8 of N-type are provided reaching as far as the GaAs layer 1, with the high-impurity density regions 8 between the control electrodes 6 and 7 being in the mutually joined manner. The N-type high-impurity density regions 8 are formed by implanting silicon ions under the conditions of a dosage of about $5 \times 10^{13}$ cm$^{-2}$ and an acceleration voltage of about 50 keV, and then giving a short heat treatment at 900° C.

On top of the Al$_{0.3}$Ga$_{0.7}$As layer 3 on both sides of the control electrode 6, there are provided ohmic electrodes 561 and 562 consisting of AuGe/Ni electrically connected to the high-impurity density regions 8, thereby forming an E-FET 201. On the GaAs layer 4 on both sides of the control electrode 7, there are provided ohmic electrodes 571 and 572 consisting of AuGe/Ni electrically connected to the high-impurity density regions 8, thereby forming a D-FET 202. The ohmic electrodes 562 and 571 are provided mutually joined together.

The channel layers for the E-FET 201 and the D-FET 202 are offered by the GaAs layer 2 for both, and the current threshold voltage for each is adjusted by the presence or the absence of the GaAs layer 4.

The representative performance indices of the E-FET 201 and the D-FET 202 of the present invention are as shown in Table 1 below.

TABLE 1

| | Performance Index | E-FET 201 | D-FET 202 |
|---|---|---|---|
| Length of Control Electrode (Gate Length) | Lg (μm) | 1 | 1 |
| Threshold Voltage | Vt (V) | 0.2 | −0.6 |
| Transconductance | gm (mS/mm) | 350 | 300 |
| Gate Forward Turn-on Voltage | Vr (V) | 1.15 | 1 |
| Gate Breakdown Voltage | BVg (V) | 8 | 8 |

Referring to Table 1, the forward turn-on voltage Vr for the gate is about 1 V for both of the E-FET 201 and the D-FET 202, showing an improvement of about 0.4 V over the conventional GaAs MESFETs. In addition, the gate breakdown voltage is also about twice that of the conventional GaAs MESFET. Further, the transconductance gm which is the index of the high-speed performance of the semiconductor integrated device is also sufficiently large.

An inverter with the DCFL circuit structure using the semiconductor integrated device of the present invention and a ring oscillator using the inverter were fabricated. It was found that the oscillator showed a satisfactory result with a noise margin of about 0.4 V, a no-load gate delay time of 25 ps/s and a power consumption per gate of 0.6 mW. Further, it was confirmed that the oscillator operated satisfactorily at temperatures near 100° C. and that the semiconductor device of the present invention possesses a sufficient operation noise margin for the circuit, working at high speed with low power consumption.

It is to be noted that an N-type high-impurity density regions 8 were formed in the present embodiment by means of the ion implantation method. However, the regions may be formed by some other method, for example, a method in which an N-type high-impurity density semiconductor layer (for instance, N-GaAs layer) is selectively grown epitaxially by the use of the organometallic chemical vapor growth method (MOCVD method).

Second Embodiment

Figure 2:
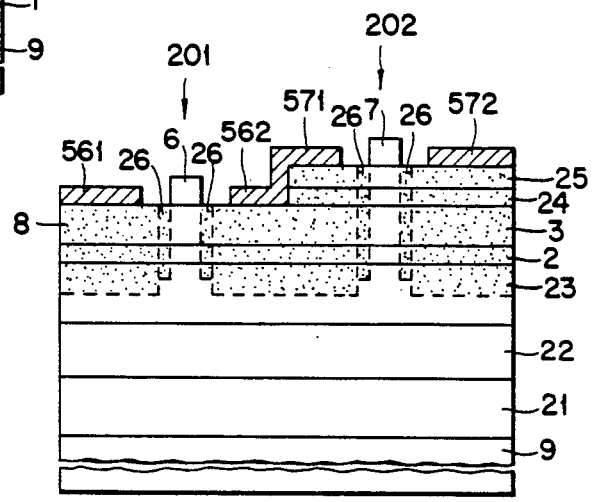
FIG. 2 is a sectional view of the structure of the important parts of a second embodiment of the semiconductor integrated device of the present invention.

Referring to FIG. 2, an undoped GaAs layer 21 with thickness of 5000 Å is provided on a semi-insulating substrate 9, an undoped Al$_{0.3}$Ga$_{0.7}$As layer 22 with thickness of 1000 Å is provided on the GaAs layer 21, an undoped GaAs layer 23 with thickness of 1000 Å is provided on the Al$_{0.3}$Ga$_{0.7}$As layer 22, an N-type GaAs layer 2 with thickness of 100 Å with impurity density of $2 \times 10^{18}$ cm$^{-3}$ is provided on the GaAs layer 23 and an undoped Al$_{0.3}$Ga$_{0.7}$As layer 3 with thickness of 250 Å is provided on the GaAs layer 2.

On the Al$_{0.3}$Ga$_{0.7}$As the layer 3 on the right-hand side, there is provided an N-type GaAs layer 24 with thickness of 100 Å and an impurity density of $2 \times 10^{18}$ cm$^{-3}$, and an undoped GaAs layer 25 with thickness of 100 Å is provided on the GaAs layer 24. On the Al$_{0.3}$Ga$_{0.7}$As layer 3 on the left-hand side and on the GaAs layer 25 on the right-hand side, there are provided control electrodes consisting of WSi 6 and 7, respectively. On both sides of the respective control electrodes 6 and 7, there are provided N-type intermediate-impurity density regions 26, reaching the depth as far as the GaAs layer 23. On the outside of the intermediate-impurity density regions 26 provided on both sides of the electrodes 6 and 7, high-impurity density regions 8 of N-type are provided reaching even the GaAs layer 23 and to beyond the intermediate-impurity density regions 26, while the high-impurity density regions 8 between the control electrodes 6 and 7 are provided mutually joined.

The high-impurity density regions and the intermediate-impurity regions 26 are fabricated as in the following. First, after depositing and treating WSi which is to become the gate metal, SiO$_2$ is deposited all over the surface to the thickness of 3000 Å by means of a CVD method, an anisotropic dry etching using gaoeous CF$_4$ is applied to leave SiO$_2$ only on the sidewalls of the gate metal. Next, silicon ions are implanted with the dosage of about $5 \times 10^{13}$ cm$^{-2}$ under the condition of acceleration voltage of about 50 KeV. The, after removing the SiO$_2$ sidewalls with an acidic solution, silicon ions are implanted again with the dosage of about $1 \times 10^{13}$ cm$^{-2}$ under the condition of acceleration voltage of about 30 KeV. Subsequently, a short heat treatment at 900° C. is given.

On top of the Al$_{0.3}$Ga$_{0.7}$As layer 3 on both sides of the control electrode 6, there are provided ohmic electrodes 561 and 562 consisting of AuGe/Ni connected electrically to the high-impurity regions 8, forming an E-FET 201. On top of the GaAs layer 25 on both sides of the control electrode 7, there are provided ohmic electrodes 571 and 572 consisting of AuGe/Ni connected electrically to the high-impurity density regions 8, forming a D-FET 202. The ohmic electrodes 562 and 571 are provided mutually joined.

The representative performance indices of the E-FET 201 and the D-FET 202 of the present embodiment are as shown in Table 2 below.

TABLE 2

| | Performance Index | E-FET 201 | D-FET 202 |
| --- | --- | --- | --- |
| Length of Control Electrode (Gate Length) | Lg (μm) | 1 | 1 |
| Threshold Voltage | Vt (V) | 0.2 | −0.6 |
| Transconductance | gm (mS/mm) | 350 | 400 |
| Gate Forward Turn-on Voltage | Vr (V) | 1.15 | 0.9 |
| Gate Breakdown Voltage | BVg (V) | 10 | 8 |

In the present embodiment, there are two channel layers 2 and 24 on the D-FET side, and the N-type GaAs layer 24 is provided so that the distances between the control electrode 7 and the channel layers 2 and 24 are short, gm of the D-FET is increased, which are more advantageous for increasing the speed of operation. Namely, to realize a high-speed integrated circuit, it becomes important to increase the speed of the basic integrated circuit in the interior and the input and output buffer integrated circuit. In particular, the latter condition requires a large load driving capability so that it is usually frequent to employ a D-FET with high gm value. Accordingly, an improvement of gm of a D-FET is effective for increasing the operating speed of the integrated circuit as a whole.

Further, the forward turn-on voltage Vr of the gate becomes small compared with that of the first embodiment, differing substantially from Vr of the E-FET so that the formation of two level shift diodes become feasible. In other words, in order to give interchangeability with the voltage level of the other integrated circuit such as an ECL circuit, there may occur a case of need for carrying out level shifting by the use of a BFL (buffered FET logic) circuit, for example, in which case it is usual to utilize the turn-on volt Vr of the diode. It means in the case of the present embodiment that the degree of freedom of design can be improved since Vr values for the E-FET and the D-FET are different.

Moreover, since the so-called LDD (lightly doped drain) structure is adopted by providing N-type intermediate-impurity density regions 26 in the vicinity of the control electrodes 6 and 7, the short-channel effect can be constrained and the gate breakdown voltage can be increased. In addition, since, a hetero-buffer layer 22 consisting of AlGaAs is provided, the short-channel effect can be reduced and satisfactory characteristics can be secured even for an elements with short channels.

Still further, an inverter with DCFL circuit structure and a ring oscillator using the DCFL circuit were manufactured using the semiconductor integrated device of the present invention. It was formed that there was obtained a satisfactory result with a noise margin of about 0.4 V, a no-load gate delay time of 25 ps/s and a power consumption per gate of 0.6 mW. In addition, the oscillator operated satisfactorily at high temperatures in the vicinity of 100° C., confirming that the semiconductor integrated device of the present invention has a sufficient noise margin of the circuit, and that it can be operated at high speed with low power consumption.

It should be noted in the first and the second embodiments in the above that in order to suppress the step difference due to integration of the E-FET 201 and the D-FET 202 to a possible minimum, set the threshold voltages of both FETs to desired values, and further, to avoid spoiling the element performance, the following conditions are desirable to be satisfied. Namely, the impurity density be in the range of $5 \times 10^{17}$–$5 \times 10^{18}$ cm$^{-3}$ and the thickness be in the range of 50–500 Å for the GaAs layer 2, the impurity density in the range of $1 \times 10^{13}$–$1 \times 10^{17}$ cm$^{-3}$ and the thickness in the range of 50–1000 Å for the Al$_{0.3}$Ga$_{0.7}$As layer 3, the impurity density in the range of $1 \times 10^{13}$–$1 \times 10^{17}$ cm$^{-3}$ and the thickness in the range of 50–1000 Å for the GaAs layer 4 and the impurity density in the range of $1 \times 10^{17}$–$5 \times 10^{18}$ cm$^{-3}$ and the thickness in the range of 50–500 Å for the GaAs layer 24.

Third Embodiment

Figure 3:
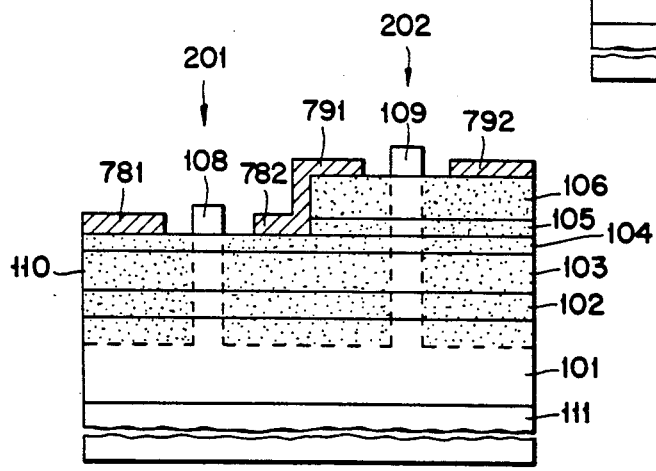
FIG. 3 is a sectional view of the structure of the important parts of a third embodiment of the semiconductor integrated device of the present invention.

Referring to FIG. 3, an undoped GaAs layer 101 with thickness of 5000 Å is provided on a semi-insulating substrate 111, an N-type GaAs layer 102 with thickness of 100 Å and an impurity density of $2 \times 10^{18}$ cm$^{-3}$ is provided on the GaAs layer 101, an undoped Al$_{0.3}$Ga$_{0.7}$As layer 103 with thickness of 200 Å is provided on the GaAs layer 102 and an undoped GaAs layer 104 with thickness of 50 Å is provided on the Al$_{0.3}$Ga$_{0.7}$As layer 103. An undoped Al$_{0.3}$Ga$_{0.7}$As layer 105 with thickness of 50 Å is provided on the GaAs layer 104 on the right-hand side, and an undoped GaAs layer 106 with thickness of 200 Å is provided on the Al$_{0.3}$Ga$_{0.7}$As layer 105.

Control electrodes 108 and 109 consisting of WSi are provided on the GaAs layer 104 on the left-hand side and the GaAs layer 106 on the right-hand side, respectively. On both sides of the control electrodes 108 and 109, there are provided N-type high-impurity density regions 110 reaching the GaAs layer 101, with the high-impurity density regions 110 between the control electrodes 108 and 109 being provided to be joined with each other. The N-type high-impurity density regions 110 are formed by giving a short heat treatment at 900° C. after implantation of silicon ions under the conditions of a dosage of about $5 \times 10^{13}$ cm$^{-2}$ and an acceleration voltage of about 50 KeV.

On top of the GaAs layer 104 on both sides of the control electrode 108, there are provided ohmic electrodes 781 and 782 consisting of AuGe/Ni, connected electrically to the high-impurity density regions 110, forming an E-FET 201. On top of the GaAs layer 106 on both sides of the control electrode 109, there are provided ohmic electrodes 791 and 792 consisting of AuGe/Ni, connected electrically to the high-impurity density regions 110, forming a D-FET 202. The ohmic electrodes 782 and 791 are provided joined with each other. The channels for the E-FET 201 and the D-FET 202 are offered by the GaAs layer 102. In the present embodiment, the surface of the E-FET 201 is constructed with a stable undoped GaAs layer 104 so that it is possible to reduce the ohmic resistance.

The representative indices of the E-FET 201 and the D-FET 202 are as shown in Table 3 below.

TABLE 3

| | Performance Index | E-FET 201 | D-FET 202 |
|---|---|---|---|
| Length of Control Electrode (Gate Length) | Lg (μm) | 1 | 1 |
| Threshold Voltage | Vt (V) | 0.2 | −0.6 |
| Transconductance | gm (mS/mm) | 350 | 300 |
| Gate Forward Turn-on Voltage | Vr (V) | 1 | 1 |
| Gate Breakdown Voltage | BVg (V) | 8 | 8 |

Referring to Table 3, the forward turn voltage Vr of the gate is about 1 V for both types of FETs, with an improvement of about 0.25 V over the conventional GaAs MESFETs. Further, the gate breakdown voltage is also about twice as large that of the convention GaAs MESFET. The value of gm which is the index of the speed of the integrated device was also sufficiently large.

An inverter with DCFL circuit structure using the semiconductor integrated device of the present embodiment, and a ring oscillator utilizing the inverter were fabricated. It was found from the measurement on the oscillator that a satisfactory result was obtained with about 0.35 V of the noise margin, a no-load gate delay time of 25 ps/s, and a power consumption per gate of 0.6 mW. Further, it was confirmed that the oscillator performed satisfactorily at high temperatures in the vicinity of 100° C., and that the semiconductor integrated device of the present invention has a sufficient operational noise margin of the circuit, and moreover, that it can be operated at high speed with low power consumption.

Further, in the present embodiment, the N-type high-impurity density regions 110 were formed by ion implantation. However, the regions can also be formed by other method such as one in which N-type high-impurity density semiconductor layers (N-GaAs, for example) can be selectively grown epitaxially by means of the organometallic vapor growth method (MOCVD method).

Fourth Embodiment

Figure 4:
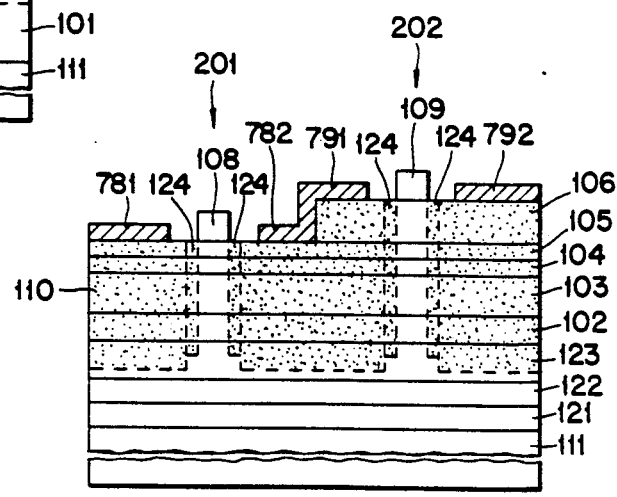
FIG. 4 is a sectional view of the structure of the important parts of a fourth embodiment of the semiconductor integrated device of the present invention.

Referring to FIG. 4, an undoped GaAs layer 121 with thickness of 5000 Å is provided on a semi-insulating substrate 111, an undoped $Al_{0.3}Ga_{0.7}As$ layer 122 with thickness of 1000 Å is provided on the GaAs layer 121, an undoped GaAs layer 123 with thickness of 1000 Å is provided on the $Al_{0.3}Ga_{0.7}As$ layer 122, an N-type GaAs layer 102 with thickness of 100 Å and impurity density of $2\times 10^{18}$ cm$^{-3}$ is provided on the GaAs layer 123, an undoped $Al_{0.3}Ga_{0.7}As$ layer 103 with thickness of 200 Å is provided on the GaAs layer 102, an undoped GaAs layer 104 with thickness of 50 Å is provided on the $Al_{0.3}Ga_{0.7}As$ layer 103 and an undoped $Al_{0.5}Ga_{0.5}As$ layer 105 with thickness of 100 Å is provided on the GaAs layer 104. An undoped GaAs layer 106 with thickness of 150 Å is provided on the $Al_{0.5}Ga_{0.5}As$ layer 105 on the right-hand side.

Control electrodes 108 and 109 are provided on top of the $Al_{0.5}Ga_{0.5}As$ layer 105 on the left-hand side and on top of the GaAs layer 106 on the right-hand side, respectively. On both sides of the control electrodes 108 and 109, there are provided N-type intermediate-impurity density regions 124 reaching even the GaAs layer 123. On the outside of the intermediate-impurity density regions 124 on both sides of the control electrodes 108 and 109, there are provided N-type high-impurity density regions 110 reaching even the GaAs layer 123, and moreover, deeper than the intermediate-impurity density regions 124, and the high-impurity density regions 110 between the control electrodes 108 and 109 are provided joined with each other.

The high-impurity regions 110 and the intermediate-impurity regions 124 are manufactured as in the following. First, after deposition and treatment of WSi which is to become the gate metal, $SiO_2$ is deposited to a thickness of 3000 Å all over the surface by CVD process, and $SiO_2$ is left only on the sidewalls of the gate metal by an anisotropic dry etching using $CF_4$ gas. Next, silicon ions are implanted under the conditions of dosage of about $5\times 10^{13}$ cm$^{-2}$ and an acceleration voltage of about 50 KeV. Then, after removing the $SiO_2$ sidewalls using an acidic solution, silicon ions are implanted again under the conditions of dosage of about $1\times 10^{13}$ cm$^{-2}$ and an acceleration voltage of about 30 KeV. Subsequently, a short heat treatment is given at 900° C.

Ohmic electrodes 781 and 782 consisting of AuGe/Ni are provided on top of the $Al_{0.5}Ga_{0.5}As$ layer 105 on both sides of the control electrode 108, connected electrically to the high-impurity density regions 110, forming an E-FET 201. Ohmic electrodes 791 and 792 consisting of AuGe/Ni are provided on top of the GaAs layer 106 on both sides of the control electrode 109, connected electrically to the high-impurity density regions 110, forming a D-FET 202. The ohmic electrodes 782 and 791 are provided joined with each other.

The representative insides of the E-FET 201 and the D-FET 202 of the present embodiment are as shown in Table 4 below.

TABLE 4

| | Performance Index | E-FET 201 | D-FET 202 |
|---|---|---|---|
| Length of Control Electrode (Gate Length) | Lg (μm) | 1 | 1 |
| Threshold Voltage | Vt (V) | 0.2 | −0.6 |
| Transconductance | gm (mS/mm) | 350 | 300 |
| Gate Forward Turn-on Voltage | Vr (V) | 1.15 | 1 |
| Gate Breakdown Voltage | BVg (V) | 10 | 10 |

In this embodiment, channels for the E-FET 201 and the D-FET 202 are provided by the GaAs layer 102, and the current threshold voltage is adjusted by the presence or absence of the semiconductor layer 106 above the layer 102. Further, since the control electrode 108 of the E-FET 201 is formed on the $Al_{0.5}Ga_{0.5}As$ layer 105 which has an energy gap greater than that of the GaAs layer, the forward rise voltage Vr of the gate is further raised compared with the case of Third Embodiment. Moreover, the control electrodes 108 and 109 are given the so-called LDD structure by providing N-type intermediate-impurity density regions 124 in their vicinity, so that the short-channel effect is suppressed and the gate breakdown voltage is increased also. Still further, a hetero buffer layer 122 consisting of AlGaAs is provided so that the short-channel effect can be reduced and it was possible to obtain satisfactory characteristics even for elements with short channel length. In addition, an inverter with DCFL circuit structure using the semiconductor integrated device of the present embodiment, and a ring oscillator utilizing the inverter were fabricated. There was obtained a satisfactory result in which the noise margin was about 0.4 V, the no-load gate delay time of 25 ps/s and the power consumption per gate of 0.6 mW. Further, it was confirmed that the oscillator operated satisfactorily even at temperatures in the vicinity of 100° C., and that the semiconductor integrated device of the present invention possesses a sufficient operational noise margin of the circuit, and it can operate at high speed with low power consumption.

It should be noted that the ohmic electrodes 781 and 782 on the E-FET side are formed on the $Al_{0.5}Ga_{0.5}As$ layer 105. However, it is possible to form the electrodes on the GaAs layer 104 by removing the layer 105 in the region near the ohmic electrode.

Fifth Embodiment

Figure 5:
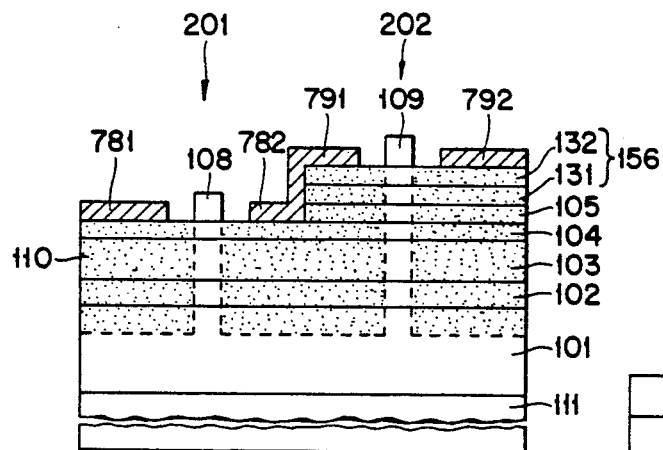
FIG. 5 is a sectional view of the structure of the important parts of a fifth embodiment of the semiconductor integrated device of the present invention.

Referring to FIG. 5, an undoped GaAs layer 101 with thickness of 5000 Å is provided on a semi-insulating substrate 111, an N-type GaAs layer 102 with thickness of 100 Å and impurity density of $2 \times 10^{18}$ cm$^{-3}$ is provided on the GaAs layer 101, an undoped $Al_{0.3}Ga_{0.7}As$ layer 103 with thickness of 200 Å is provided on the GaAs layer 102 and an undoped GaAs layer 104 with thickness of 50 Å is provided on the $Al_{0.3}Ga_{0.7}As$ layer 103.

An undoped $Al_{0.3}Ga_{0.7}As$ layer 105 with thickness of 50 Å is provided on the GaAs layer 104 on the right-hand side, an N-type GaAs layer 131 with thickness of 100 Å and impurity density of $2 \times 10^{18}$ cm$^{-3}$ is provided on the $Al_{0.3}Ga_{0.7}As$ layer 105 and an undoped GaAs layer 132 with thickness of 50 Å is provided on the GaAs layer 131. A semiconductor layer 156 is formed by the combination of the GaAs layer 131 and the GaAs layer 132.

Control electrodes 108 and 109 consisting of WSi are provided on top of the GaAs layer 104 of the left-hand side and on the GaAs layer 132 on the right-hand side.

High-impurity density regions 110 of N-type are provided on both sides of the control electrodes 108 and 109 reaching even the GaAs layer 101, and the high-impurity density regions 110 between the control electrodes 108 and 109 are provided joined with each other. The N-type high-impurity density regions 110 are formed by a short heat treatment at 900° C. after implantation of silicon ions under the conditions of a dosage of about $5 \times 10^{13}$ cm$^{-2}$ and an acceleration voltage of about 50 KeV.

Ohmic electrodes 781 and 782 consisting of AuGe/Ni are provided on top of the GaAs layer 104 on both sides of the control electrode 108, connected electrically to the high-impurity density regions 110, forming an E-FET 201. Ohmic electrodes 791 and 792 consisting of AuGe/Ni are provided on top of the GaAs layer 132 on both sides of the control electrode 109, connected electrically to the high-impurity density regions 110, forming a D-FET 202. The ohmic electrodes 782 and 791 are joined with each other.

The representative indices of the E-FET 201 and the D-FET 202 of the present embodiment are as shown in Table 5 below.

TABLE 5

| Performance Index | | E-FET 201 | D-FET 202 |
|---|---|---|---|
| Length of Control Electrode (Gate Length) | Lg (μm) | 1 | 1 |
| Threshold Voltage | Vt (V) | 0.2 | −0.6 |
| Transconductance | gm (mS/mm) | 350 | 400 |
| Gate Forward Turn-on Voltage | Vr (V) | 1 | 0.9 |
| Gate Breakdown Voltage | BNg (V) | 8 | 7 |

The D-FET 202 of the present embodiment has two channel layers 102 and 131 so that the value for gm is large compared with that of the third embodiment. Further, N-type GaAs layer 131 is provided on the D-FET 202 side so that the distances between the control electrode and the channel layers 102 and 131 are made short with an increased value for gm, making it advantageous for increasing the speed of operation. Namely, in order to realize a high-speed integrated circuit, it becomes important to increase the speed of the internal basic integrated circuit and to increase the speed of the input and output buffer integrated circuit. In particular, a large load driving capability is required for the latter purpose so that it is usually frequent to employ a D-FET with high gm value. Accordingly, an enhancement of gm of a D-FET 202 is effective for operating the whole integrated circuit at high speed.

Further, the gate forward turn-on voltage Vr can be reduced compared with that of the third embodiment, being significantly different from $V_r$ for the E-FET 201, so that there arises a possibility of forming two level shift diodes. In other words, there may arise the necessity of executing level shifting by the use, for example, of a BFL circuit in order to realize interchangeability of the voltage level with other integrated circuit such as an ECL circuit, in which case it is usual to utilize the rise voltage Vr of the diode. In the case of the present invention, Vr values differ for the E-FET and for the D-FET so that it becomes possible to improve the degree of freedom in designing the circuit.

It is to be noted in the third embodiment to the fifth embodiment that in order to keep the step difference between the E-FET 201 and the D-FET 202 due to device integration to a possible minimum, and yet to set the threshold voltages for both FETs to desired values, and further, to avoid spoilage of the element performance, it is desirable to satisfy the following conditions. Namely, the impurity density of the GaAs layer 102 is to be found in the range of $5 \times 10^{17}$–$5 \times 10^{18}$ cm$^{-3}$ and its thickness is to be found in the range of 50–500 Å, the impurity density of the $Al_{0.3}Ga_{0.7}As$ layer 103 in the range of $1 \times 10^{13}$–$1 \times 10^{17}$ cm$^{-3}$ and its thickness in the range of 50–1000 Å, the impurity density of the GaAs layer 104 in the range of $1 \times 10^{13}$–$1 \times 10^{17}$ cm$^{-3}$ and its thickness in the range of 10–500 Å, the impurity density of the $Al_{0.3}Ga_{0.7}As$ layer 105 in the range of $1 \times 10^{13}$–$1 \times 10^{17}$ cm$^{-3}$ and its thickness in the range of 50–500 Å, the impurity density of the GaAs layer 106 in the range of $1 \times 10^{13}$–$1 \times 10^{17}$ cm$^{-3}$ and its thickness in the range of 50–1000 Å and the impurity density of the GaAs layer 131 in the range of $1 \times 10^{17}$–$5 \times 10^{18}$ cm$^{-3}$ and its thickness in the range of 50–500 Å.

In the above embodiments, description has been presented in conjunction with semiconductor devices that utilize electrons as the carriers. However, the present invention is similarly applicable to the case of utilizing holes as carriers. Therefore, embodiments of semiconductor integrated devices that utilize positive holes as carriers will be described next.

Sixth Embodiment

The sectional view for the important parts of the semiconductor integrated device of the present embodiment is similar to that of FIG. 1. Namely, in FIG. 1, use is made respectively of an undoped GaAs layer with thickness of 5000 Å as the semiconductor layer 1 on a semi-insulating substrate 9, a P-type Ge layer with thickness of 100 Å and impurity density of $2 \times 10^{18}$ cm$^{-3}$ as the semiconductor layer 2, an undoped Al$_{0.3}$Ga$_{0.7}$As layer with thickness of 250 Å as the semiconductor layer 3, an undoped Ge layer with thickness of 250 Å as the semiconductor layer 4, AuZn as the ohmic electrodes 561, 562, 571 and 572, and WSi is used for the control electrodes 6 and 7. In addition, the P-type high-impurity density regions 8 are formed by a short heat treatment at 900° C. after implantation of beryllium ions under the conditions of a dosage of about $5 \times 10^{13}$ cm$^{-2}$ and an acceleration voltage of about 50 keV.

In the present embodiment, analogous to the case of utilizing electrons as carriers, there was observed an improvement, especially in the forward turn-on voltage Vr of the gate, over the conventional GaAs MESFET. Further, it was confirmed that the semiconductor device in accordance with the present invention possesses a sufficient operational noise margin and that it can be operated at high speed with low power consumption.

The present embodiment is what will form a pair with the semiconductor device of the first embodiment that utilizes electrons as carriers. However, considering the principle of the present invention it is obvious that it is feasible to obtain a semiconductor integrated device utilizing holes as carriers that corresponds to the second embodiment.

Seventh Embodiment

The sectional view for the important parts of the semiconductor device of the present embodiment is analogous to that of FIG. 3. Namely, in FIG. 3, use is made respectively of an undoped GaAs layer with thickness of 5000 Å as the semiconductor layer 1 on a semi-insulating substrate 11, a P-type Ge layer with thickness of 100 Å and impurity density of $2 \times 10^{18}$ cm$^{-3}$ as the semiconductor layer 102, and undoped Al$_{0.3}$Ga$_{0.7}$As layer with thickness of 200 Å as the semiconductor layer 103, an undoped Al$_{0.3}$Ga$_{0.7}$As layer with thickness of 50 Å as the semiconductor layer 105, an undoped GaAs layer with thickness of 200 Å as the semiconductor layer 106, AuZn as the ohmic electrodes 781, 782, 791 and 792, and WSi as the control electrodes 108 and 109. Further, the P-type high-impurity density regions 110 are formed by a short heat treatment after implantation of beryllium ions under the conditions of a dosage of about $5 \times 10^{13}$ cm$^{-2}$ and an acceleration voltage of about 50 keV.

In the present embodiment, an improvement especially with respect to Vr over the conventional GaAs MESFET was obtained analogous to the case of using electrons as carriers. Further, it was confirmed that the semiconductor integrated device of the present invention possesses a sufficient operational noise margin for the circuit, and that it can be operated at high speed with low power consumption.

The present embodiment is what will form a pair with the third embodiment of the semiconductor device that utilizes electrons as carriers. However, considering the principle of the present invention, it is obvious that semiconductor devices having holes as carriers that correspond to the second and the third embodiments are feasible.

In the embodiments described in the above, use was made of GaAs, AlGaAs and Ge as semiconductor materials, but it is also possible to use other semiconductor materials such as InGaAs, InAlAs, InP, GaSb, InSb and Si.

It is to be noted that in order to supress the leak current after current cut-off and to suppress malfunctions and power consumption of the integrated circuit, the impurity density of the high-resistance buffer layer (semiconductor layer below the channel layer) is desirable to be less than $1 \times 10^{16}$ cm$^{-3}$ for an impurity with the same conductivity type as that of the channel or less than $5 \times 10^{17}$ cm$^{-3}$ for an impurity with the opposite conductivity type.

Eighth Embodiment

Figure 6A:
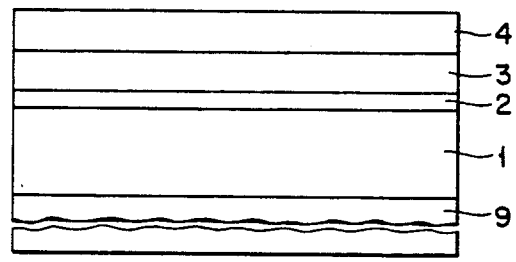
FIG. 6(a) to FIG. 6(c) are sectional views for illustrating an eighth embodiment of the present invention.
Figure 6B:
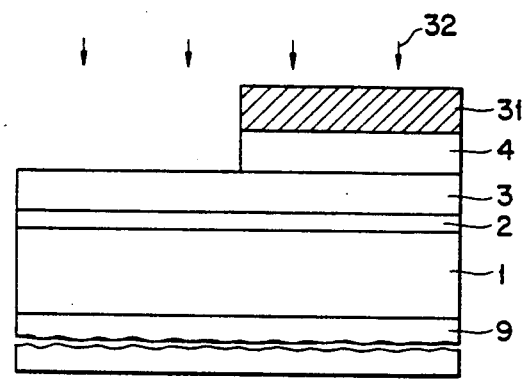
Figure 6C:
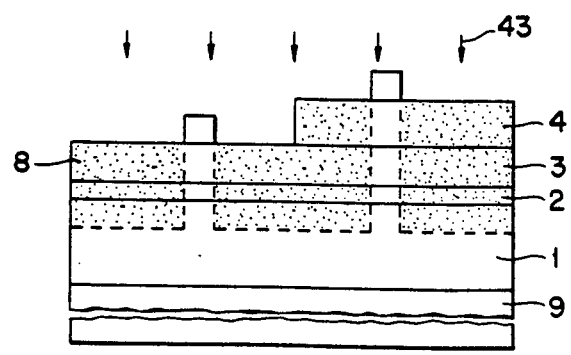

Referring to FIG. 6 (a), an undoped GaAs layer with thickness of 5000 Å as the semiconductor layer 1 on a semi-insulating substrate, an N-type GaAs layer with thickness of 100 Å and impurity density of $2 \times 10^{18}$ cm$^{-3}$ as the semiconductor layer 2, an undoped Al$_{0.5}$Ga$_{0.5}$As layer with thickness of 250 Å as the semiconductor layer 3 and an undoped GaAs layer 4 with thickness of 250 Å, are grown sequentially by molecular beam epitaxial (MBE) method.

Next, the region which is to become the D-FET is masked with a photoresist 31, the undoped GaAs layer 4 is removed selectively by dry etching with a mixed gas 32 of CCl$_2$F$_2$ and He, as shown in FIG. 6 (b), to form the region of E-FET. In this case, use is made of isotropic etching conditions which have low self bias voltage and minimize damage to the device.

Next, the photoresist 31 is removed, WSi is deposited by sputtering and it is treated by dry etching as shown in FIG. 6 (c). Then, silicon ions 43 are implanted under the conditions of a dosage of about $5 \times 10^{13}$ cm$^{-2}$ and an acceleration voltage of about 50 keV, and a short heat treatment at 900° C. is given. Subsequently, AuGe/Ni is deposited as ohmic electrodes are deposited and alloyed by heat treatment. Finally, wirings between the elements are given, completing the manufacture.

The standard deviation σVt of the threshold voltage Vt of the elements obtained by the present invention was a satisfactory value of about 20 mV. Further, a circuit manufactured with DCFL circuit structure gave a confirmation that it possesed a satisfactory performance similar to that of the first embodiment. Moreover, view formity and reproducibity of elements were also excellent.

Ninth Embodiment

Figure 7A:
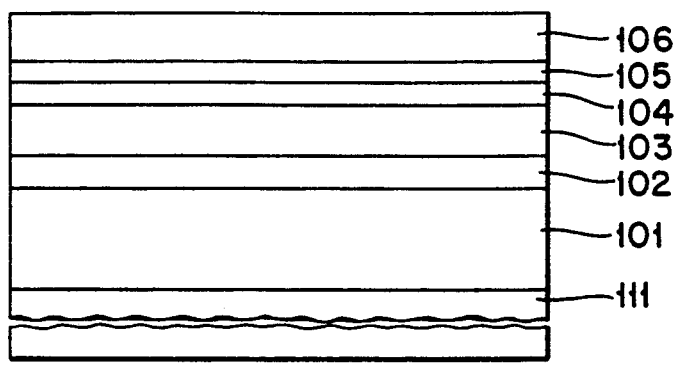
FIG. 7(a) to FIG. 7(c) are sectional views for illustrating a ninth embodiment of the present invention.
Figure 7B:
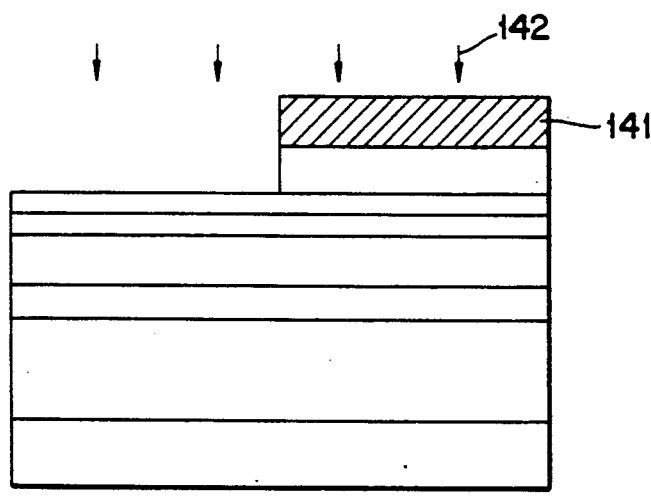
Figure 7C:
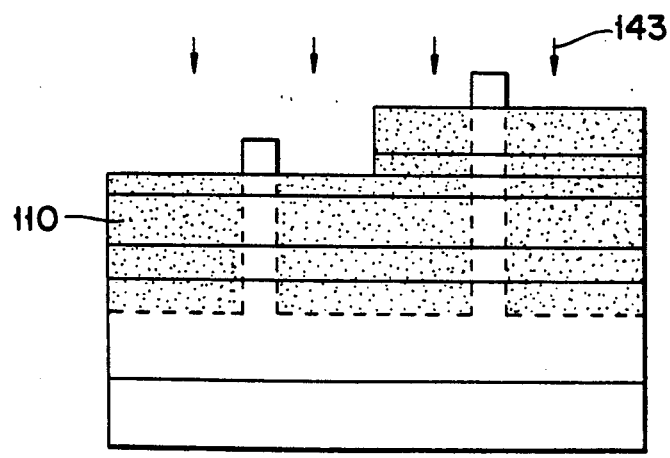

Referring to FIG. 7 (a), an undoped GaAs layer with thickness of 5000 Å as the semiconductor layer 101 on a semi-insulating substrate, an N-type GaAs layer with thickness of 100 Å and impurity of $2 \times 10^{18}$ cm$^{-3}$ as the semiconductor layer 102, and undoped Al$_{0.3}$Gaihd 0.7As layer with thickness of 200 Å as the semiconductor layer 103, an undoped GaAs layer with thickness of 50 Å as the semiconductor layer 104, an undoped Al$_{0.3}$Ga$_{0.7}$As layer with thickness of 50 Å as the semiconductor layer 105 and an undoped GaAs layer with thickness of 200 Å as the semiconductor layer 106, are grown sequentially by means of the MBE method.

Next, the undoped GaAs layer 106 is removed selectively by means of dry etching with a mixed gas 142 of $CCl_2F_2$ and He using photoresist 141 as a mask on the region to become a D-FET, to form the region for an E-FET, as shown in FIG. 7 (b). In this case, use is made of isotropic etching conditions having low self-bias voltage and minimize damage to the device.

Next, the $Al_{0.3}Ga_{0.7}As$ layer 105 in the region for the E-FET is removed with phosphoric acid etching solution. After removal of the photoresist 141, WSi is deposited by the sputtering method, and treated with the dry etching method. Then, silicon ions 143 are implanted under the conditions of a dosage of about $5 \times 10^{13}$ cm$^{-2}$ and an acceleration voltage of about 50 keV, and a short heat treatment at 900° C. is given. Subsequently, AuGe/Ni is deposited as ohmic electrodes and alloyed by heat treatment. Finally, wirings are given between the elements, completing the manufacture of the device.

The standard deviation $\sigma Vt$ of the threshold voltage Vt of the elements obtained by the present invention was a satisfactory value of about 20 mV. Further, manufacture of a circuit using the DCFL circuit structure confirmed that the circuit possesses a satisfactory performance as that of the third embodiment. Moreover, the uniformity and the reproducibility of the element characteristics were excellent.

It should be noted that the $Al_{0.3}Ga_{0.7}As$ layer 105 for the E-FET region was removed using a phosphoric acid solution. However, WSi may be deposited and treated by leaving the semiconductor layer as is. In this case, there is obtained an improvement of Vr as mentioned in connection with the fourth embodiment.

Further, in the eighth and the ninth embodiments, it is possible to use a mixed gas which is a combination taken from a group of gases such as $O_2$, $Cl_2$, $CCl_4$, $CBrF_3$, $CF_4$, $SiCl_4$, $SF_6$, HCl and HBr, as a gas 32 or 142 for dry etching. Moreover, tartaric acid, ammonium fluoride solution or the like may be used in place of the dry etching gases 32 and 142.

Moreover, these embodiments represent manufacturing methods of semiconductor integrated devices which use electrons as carriers. However, it is obvious by considering the principle of the present invention that these are similarly applicable, as a rule, also to the manufacture of semiconductor devices that utilize holes as carriers.

What is claimed is:

1. A semiconductor device comprising:
 a substrate;
 a first semiconductor layer with a low impurity density provided on said substrate;
 an N-type second semiconductor layer with a high impurity density provided on said first semiconductor layer, said second semiconductor layer acting as a channel layer;
 a third semiconductor layer with a low impurity density provided on said second semiconductor layer, an electron affinity of said third semiconductor layer being smaller than that of said second semiconductor layer, and said third semiconductor layer having a first surface portion and a second surface portion;
 an N-type fourth semiconductor layer with a high impurity density provided on said second surface portion of said third semiconductor layer;
 a fifth semiconductor layer with a low impurity density provided on said fourth semiconductor layer, an impurity density of said second semiconductor layer being higher than those of said first, third and fifth semiconductor layers, and an impurity density of said fourth semiconductor layer being higher than those of said first, third and fifth semiconductor layers;
 a first control electrode provided on said first surface portion of said third semiconductor layer;
 a first N-type high impurity density region and a second N-type high impurity density region provided respectively on both sides of said first control electrode, said first and second N-type high impurity density regions extending from said first surface portion of said third semiconductor layer and reaching said second semiconductor layer, impurity densities of said first and second N-type high impurity density regions being higher than those of said second and third semiconductor layers;
 a first electrode and a second electrode respectively provided on said first N-type high impurity density region and on said second N-type high impurity density region;
 a second control electrode provided on said fifth semiconductor layer;
 a third N-type high impurity density region and a fourth N-type high impurity density region provided respectively on both sides of said second control electrode, said third and fourth N-type high impurity density regions extending from a surface of said fifth semiconductor layer and reaching said second semiconductor layer, impurity densities of said third and fourth N-type high impurity density regions being higher than those of said second, third, fourth and fifth semiconductor layers; and
 a third electrode and a fourth electrode respectively provided on said third N-type high impurity density region and on said fourth N-type high impurity density region.

2. A semiconductor device as recited in claim 1, further comprising means for connecting said second electrode and said third electrode.

3. A semiconductor device as recited in claim 1, further comprising a first N-type intermediate impurity density region and a second N-type intermediate impurity density region with impurity densities lower than those of said first and second N-type high impurity density regions, said first and second N-type intermediate impurity regions being provided respectively between said first and second N-type high impurity density regions and said first control electrode, said first and second N-type intermediate impurity regions extending from said first surface portion of said third semiconductor layer and reaching said second semiconductor layer, and a third N-type intermediate impurity density region and a fourth N-type intermediate impurity density region with impurity densities lower than those third and fourth N-type high impurity density regions, said third and fourth N-type intermediate impurity regions being provided respectively between said third and fourth N-type high impurity density regions and said second control electrode, said third and fourth N-type intermediate impurity regions extending from said surface of said fifth semiconductor layer and reaching said second semiconductor layer.

4. A semiconductor device as recited in claim 1, further comprising a sixth semiconductor layer provided between said first semiconductor layer and said substrate, said sixth semiconductor layer having an impurity density lower than that of said second semiconductor layer and having and electron affinity smaller than that of said first semiconductor layer.

5. A semiconductor device as recited in claim 1, wherein said first semiconductor layer is a high resistance buffer layer, an impurity density of said high resistance buffer layer being less than $1 \times 10^{16}$ cm$^{-3}$ for an N-type impurity.

6. A semiconductor device as recited in claim 1, wherein said first semiconductor layer is a high resistance buffer layer, an impurity density of said high resistance buffer layer being less than $5 \times 10^{17}$ cm$^{-3}$ for a P-type impurity.

7. A semiconductor device as recited in claim 1, wherein said impurity density of said second semiconductor layer is in the range of $5 \times 10^{17} - 5 \times 10^{18}$ cm$^{-3}$, said impurity density of said third semiconductor layer is in the range of $1 \times 10^{13} - 1 \times 10^{17}$ cm$^{-3}$, and said impurity density of said fourth semiconductor layer is in the range of $1 \times 10^{17} - 5 \times 10^{18}$ cm$^{-3}$.

8. A semiconductor device as recited in claim 7, wherein a film thickness of said second semiconductor layer is in the range of 50–500 Å, a film thickness of said third semiconductor layer is in the range of 50–1000 Å, and a film thickness of said fourth semiconductor layer is in the range of 50–500 Å.

9. A semiconductor device as recited in claim 1, wherein said first semiconductor layer is an undoped gallium arsenide layer, said second semiconductor layer is an N-type gallium arsenide layer, said third semiconductor layer is an undoped aluminum gallium arsenide layer, said fourth semiconductor layer is an N-type gallium arsenide layer and said fifth semiconductor layer is an undoped gallium arsenide layer.

10. A semiconductor device as claimed in claim 9, further comprising an undoped aluminum gallium arsenide layer provided between said first semiconductor layer and said substrate.

11. A semiconductor device comprising:
a substrate;
a first semiconductor layer with a low impurity density provided on said substrate;
a second semiconductor layer with a low impurity density provided on said first semiconductor substrate, an electron affinity of said first semiconductor layer being smaller than that of said second semiconductor layer;
an N-type third semiconductor layer with a high impurity density provided on said second semiconductor layer, said third semiconductor layer acting as a channel layer;
a fourth semiconductor layer with a low impurity density provided on said third semiconductor layer, the electron affinity of said fourth semiconductor layer being smaller than that of said third semiconductor layer, and said fourth semiconductor layer having a first surface portion and a second surface portion;
a fifth semiconductor layer with a low impurity density provided on said second surface portion of said fourth semiconductor layer, an impurity density of said third semiconductor layer being higher than those of said first, second, fourth and fifth semiconductor layers;
a first control electrode provided on said first surface portion of said fourth semiconductor layer;
a first N-type high impurity density region and a second N-type high impurity density region provided respectively on both sides of said first control electrode, said first and second N-type high impurity density regions extending from said first surface portion of said fourth semiconductor layer and reaching said third semiconductor layer, impurity densities of said first and second N-type high impurity density regions being higher than those of said third and fourth semiconductor layers,
a first electrode and a second electrode respectively provided on said first N-type high impurity density region and on said second N-type high impurity density region;
a second control electrode provided on said fifth semiconductor layer;
a third N-type high impurity density region and a fourth N-type high impurity density region provided respectively on both sides of said second control electrode, said third and fourth N-type high impurity density regions extending from a surface of said fifth semiconductor layer and reaching said third semiconductor layer, impurity densities of said third and fourth N-type high impurity density regions being higher than those of said third, fourth and fifth semiconductor layers; and
a third electrode and a fourth electrode respectively provided on said third N-type high impurity density region and on said fourth N-type high impurity density region.

12. A semiconductor device as recited in claim 11, further comprising means for connecting said second electrode and said third electrode.

13. A semiconductor device as recited in claim 11, further comprising a first N-type intermediate impurtiy density region and a second N-type intermediate impurity density region with impurity densities lower than those of said first and second N-type high impurity density regions, said first and second N-type intermediate impurity regions being provided respectively between said first and second N-type high impurity density regions and said first control electrode, said first and second N-type intermediate impurity regions extending from said first surface portion of said fourth semiconductor layer and reaching said third semiconductor layer, and a third N-type intermediate impurity density region and a fourth N-type intermediate impurity density region with impurity densities lower than those third and fourth N-type high impurity density regions, said third and fourth N-type intermediate impurity regions being provided respectively between said third and fourth N-type high impurity density regions and said second control electrode, said third and fourth N-type intermediate impurity regions extending from said surface of said fifth semiconductor layer and reaching said third semiconductor layer.

14. A semiconductor device as recited in claim 11, wherein said second semiconductor layer is a high resistance buffer layer, an impurity density of said high resistance buffer layer being less than $1 \times 10^{16}$ cm$^{-3}$ for an N-type impurity.

15. A semiconductor device as recited in claim 11, wherein said second semiconductor layer is a high resistance buffer layer, an impurity density of said high resistance buffer layer being less than $5 \times 10^{17}$ cm$^{-3}$ for a P-type impurity.

16. A semiconductor device as recited in claim 11, wherein said impurity density of said third semiconductor layer is in the range of $5 \times 10^{17} - 5 \times 10^{18}$ cm$^{-3}$, and said impurity density of said fourth semiconductor layer is in the range of $1 \times 10^{13} - 1 \times 10^{17}$ cm$^{-3}$.

17. A semiconductor device as recited in claim 16, wherein a film thickness of said third semiconductor layer is in the range of 50-500 Å, and a film thickness of said fourth semiconductor layer is in the range of $50 \times 1000$ Å.

18. A semiconductor device as recited in claim 11, wherein said first semiconductor layer is an undoped aluminum gallium arsenide layer, said second semiconductor layer is an undoped gallium arsenide layer, said third semiconductor layer is an N-type gallium arsenide layer, said fourth semiconductor layer is an undoped aluminum gallium arsenide layer, said fifth semiconductor layer is an undoped gallium arsenide layer.

19. A semiconductor device comprising:
a substrate;
a first semiconductor layer with a low impurity density provided on said substrate;
an N-type second semiconductor layer with a high impurity density provided on said first semiconductor layer, said second semiconductor layer acting as a channel layer;
a third semiconductor layer with a low impurity density provided on said second semiconductor layer, the electron affinity of said third semiconductor layer being smaller than that of said second semiconductor layer;
an undoped gallium arsenide layer provided on said third semiconductor layer, said undoped gallium arsenide layer having a first surface portion and a second surface portion;
a fourth semiconductor layer with a low impurity density provided on said second surface portion of said undoped gallium arsenide layer, an impurity density of said second semiconductor layer being higher than those of said first, third and fourth semiconductor layers;
a first contorl electrode provided on said first surface portion of said undoped gallium arsenide layer;
a first N-type high impurity density region and a second N-type high impurity density region provided respectively on both sides of said first control electrode, said first and second N-type high impurity density regions extending from said first surface portion of said undoped gallium arsenide layer and reaching said second semiconductor layer, impurity densities of said first and second N-type high impurity density regions being higher than those of said second and third semiconductor layers and said undoped gallium arsenide layer;
a first electrode and a second electrode respectively provided on said first N-type high impurity density region and on said second N-type high impurity density region;
a second control electrode provided on said fourth semiconductor layer;
a third N-type high impurity density region and a fourth N-type high impurity density region provided respectively on both sides of said second control electrode, said third and fourth N-type high impurity density regions extending from a surface of said fourth semiconductor layer and reaching said second semiconductor layer, impurity densities of said third and fourth N-type high impurity density regions being higher than those of said second, third and fourth semiconductor layers and said undoped gallium arsenide layer; and
a third electrode and a fourth electrode respectively provided on said third N-type high impurity density region and on said fourth N-type high impurity density region.

20. A semiconductor device as recited in claim 19, further comprising means for connecting said second electrode and said third electrode.

21. A semiconductor device as recited in claim 19, further comprising a fifth semiconductor layer with a low impurity density provided between said fourth semiconductor layer and said second surface portion of said undoped gallium arsenide layer, an impurity density of said fifth semiconductor layer being lower than that of said second semiconductor layer, an electron affinity of said fifth semiconductor layer being smaller than those of said fourth semiconductor layer and said undoped gallium arsenide layer, and said impurity densities of said third and fourth N-type high impurity density regions being higher than that of said fifth semiconductor layer.

22. A semiconductor device as claimed in claim 21, wherein said impurity density of said fifth semiconductor layer is in the range of $5 \times 10^{13} - 5 \times 10^{17}$ cm$^{-3}$.

23. A semiconductor device as claimed in claim 21, wherein a film thickness of said fifth semiconductor layer is in the range of 50-500 Å.

24. A semiconductor device as recited in claim 19, wherein said first semiconductor layer is a high resistance buffer layer, an impurity density of said high resistance buffer layer being less than $1 \times 10^{16}$ cm$^{-3}$ for an N-type impurity.

25. A semiconductor device as recited in claim 19, wherein said first semiconductor layer is a high resistance buffer layer, an impurity density of said high resistance buffer layer being less than $5 \times 10^{17}$ cm$^{-3}$ for a P-type impurity.

26. A semiconductor device as recited in claim 19, wherein said impurity density of said second semiconductor layer is in the range of $5 \times 10^{17} - 5 \times 10^{18}$ cm$^{-3}$ said impurity density of said third semiconductor layer is in the range of $1 \times 10^{13} - 1 \times 10^{17}$ cm$^{-3}$ and said impurity density of said fourth semiconductor layer is in the range of $1 \times 10^{13} - 1 \times 10^{17}$ cm$^{-3}$.

27. A semiconductor device as recited in claim 26, wherein a film thickness of said second semiconductor layer is in the range of 50-500 Å, a film thickness of said third semiconductor layer is in the range of 50-1000 Å, a film thickness of said undoped gallium arsenide layer is in the range of 10-500 Å, and a film thickness of said fourth semiconductor layer is in the range of 50-1000 Å.

28. A semiconductor device as recited in claim 19, wherein said first semiconductor layer is an undoped gallium arsenide layer, said second semiconductor layer is an N-type gallium arsenide layer, said third semiconductor layer is an undoped aluminum gallium arsenide layer, and said fourth semiconductor layer is an undoped gallium arsenide layer.

29. A semiconductor device as claimed in claim 19, further comprising an undoped aluminum gallium arsenide layer provided between said fourth semiconductor layer and said second surface portion of said undoped gallium arsenide layer.

30. A semiconductor device as recited in claim 19, further comprising a fifth semiconductor layer provided between said first semiconductor layer and said substrate, said fifth semiconductor layer having an impurity density lower than that of said second semiconductor layer and having an electron affinity smaller than that of said first semiconductor layer.

31. A semiconductor device as recited in claim 30, further comprising a sixth semiconductor layer provided between said fourth semiconductor layer and said second surface portion of said undoped gallium arsenide layer, said sixth semiconductor layer having an impurity density lower than that of said second semiconductor layer and having an electron affinity smaller than that of said undoped gallium arsenide layer.

32. A semiconductor device as recited in claim 31, wherein said first semiconductor layer is an undoped gallium arsenide layer, said second semiconductor layer is an N-type gallium arsenide layer, said third semiconductor layer is an undoped aluminum gallium arsenide layer, said fourth semiconductor layer is an undoped gallium arsenide layer, said fifth semiconductor layer is an undoped aluminum gallium arsenide layer, and said sixth semiconductor layer is an undoped aluminum gallium arsenide layer.

33. A semiconductor device as recited in claim 31, further comprising a seventh semiconductor layer provided between said first control electrode and said first surface portion of said undoped gallium arsenide layer, said seventh semiconductor layer having an impurity density lower than that of said second semiconductor layer and having an electron affinity smaller than that of said undoped gallium arsenide layer, said first and second N-type high impurity density regions extending from a surface of said seventh semiconductor layer, and said impurity densities of said first and second N-type high impurity density regions being higher than that of said seventh semiconductor layer.

34. A semiconductor device as recited in claim 33, wherein said first semiconductor layer is an undoped gallium arsenide layer, said second semiconductor layer is an N-type gallium arsenide layer, said third semiconductor layer is an undoped aluminum gallium arsenide layer, said fourth semiconductor layer is an undoped gallium arsenide layer, said fifth semiconductor layer is an undoped aluminum gallium arsenide layer, and said sixth and seventh semiconductor layers are undoped aluminum gallium arsenide layers.

35. A semiconductor device as recited in claim 33, wherein said impurity density of said second semiconductor layer is in the range of $5\times10^{17}$–$5\times10^{18}$ cm$^{-3}$, said impurity density of said third semiconductor layer is in the range of $1\times10^{13}$–$1\times10^{17}$ cm$^{-3}$, said impurity density of said fourth semiconductor layer is in the range of $1\times10^{13}$–$1\times10^{17}$ cm$^{-3}$, and said impurity density of said sixth and seventh semiconductor layers are in the range of $1\times10^{13}$–$1\times10^{17}$ cm$^{-3}$.

36. A semiconductor device as recited in claim 35, wherein a film thickness of said second semiconductor layer is in the range of 50–500 Å, a film thickness of said third semiconductor layer is in the range of 50–1000 Å, a film thickness of said undoped gallium arsenide layer is in the range of 10–500 Å, a film thickness of said fourth semiconductor layer is in the range of 50–1000 Å, and a film thickness of said sixth and seventh semiconductor layers are in the range of 50–500 Å.

37. A semiconductor device as recited in claim 33, wherein said first semiconductor layer is an undoped gallium arsenide layer, said second semiconductor layer is an N-type gallium arsenide layer, said third semiconductor layer is an undoped aluminum gallium arsenide layer, said fourth semiconductor layer is an undoped gallium arsenide layer, said fifth semiconductor layer is an undoped aluminum gallium arsenide layer, and said sixth and seventh semiconductor layers are undoped aluminum gallium arsenide layers.

38. A semiconductor device as recited in claim 31, wherein said impurity density of said second semiconductor layer is in the range of $5\times10^{17}$–$5\times10^{18}$ cm$^{-3}$, said impurity density of said third semiconductor layer is in the range of $1\times10^{13}$–$1\times10^{17}$ cm$^{-3}$, said impurity density of said fourth semiconductor layer is in the range of $1\times10^{13}$–$1\times10^{17}$ cm$^{-3}$, said impurity density of said sixth semiconductor layer is in the range of $1\times10^{13}$–$1\times10^{17}$ cm$^{-3}$.

39. A semiconductor device as recited in claim 38, wherein a film thickness of said second semiconductor layer is in the range of 50–500 Å, a film thickness of said third semiconductor layer is in the range of 50–1000 Å, a film thickness of said undoped gallium arsenide layer is in the range of 10–500 Å, a film thickness of said fourth semiconductor layer is in the range of 50–1000 Å, and a film thickness of said sixth semiconductor layer is in the range of 50–500 Å.

40. A semiconductor device as recited in claim 30, wherein said first semiconductor layer is an undoped gallium arsenide layer, said second semiconductor layer is an N-type gallium arsenide layer, said third semiconductor layer is an undoped aluminum gallium arsenide layer, said fourth semiconductor layer is an undoped gallium arsenide layer, and said fifth semiconductor layer is an undoped aluminum gallium arsenide layer.

41. A semiconductor device as recited in claim 19, further comprising an N-type fifth semiconductor layer with a high impurity density provided between said fourth semiconductor layer and said secoond surface portion of said undoped gallium arsenide layer, an impurity density of said fifth semiconductor layer being higher than those of said third and fourth semiconductor layer and said undoped gallium arsenide layer, an electron affinity of said fifth semiconductor layer being larger than that of said third semiconductor layer, and said impurity densities of said third and fourth N-type high impurity density regions being higher than that of said fifth semiconductor layer.

42. A semiconductor device as recited in claim 41, further comprising a sixth semiconductor layer with a low impurity density provided between said fifth semiconductor layer and said second surface portion of said undoped gallium arsenide layer, an impurity density of said sixth semiconductor layer being lower than that of said fifth semiconductor layer, and electron affinity of said sixth semiconductor layer being smaller than that of said fifth semiconductor layer, and said impurity density of said third and fourth N-type high impurity density regions being higher than that of said sixth semiconductor layer.

43. A semiconductor device as recited in claim 41, wherein said impurity density of said second semiconductor layer is in the range of $5\times10^{17}$–$5\times10^{18}$ cm$^{-3}$, said impurity density of said third semiconductor layer is in the range of $1\times10^{13}$–$1\times10^{17}$ cm$^{-3}$, said impurity density of said fifth semiconductor layer is in the range of $1\times10^{17}$–$5\times10^{18}$ cm$^{-3}$.

44. A semiconductor device as recited in claim 43, wherein a film thickness of said second semiconductor layer is in the range of 50–500 Å, a film thickness of said third semiconductor layer is in the range of 50–1000 Å, a film thickness of said undoped gallium arsenide layer is in the range of 10–500 Å, and a film thickness of said fifth semiconductor layer is in the range of 50–500 Å.

45. A semiconductor device as recited in claim 19, wherein said first semiconductor layer is an undoped gallium arsenide layer, said second semiconductor layer is an N-type gallium arsenide layer, said third semiconductor layer is an undoped aluminum gallium arsenide layer, said fourth semiconductor layer is an undoped gallium arsenide layer, and said fifth semiconductor layer is an N-type gallium arsenide layer.

46. A semiconductor device as recited in claim 45, further comprising an undoped aluminum gallium arsenide layer provided between said fifth semiconductor layer and said second surface portion of said undoped gallium arsenide layer.

47. A semiconductor device comprising:
a substrate;
a first semiconductor layer with a low impurity density provided on said substrate;
an N-type second semiconductor layer with a high impurity density provided on said first semiconductor layer, said second semiconductor layer acting as a channel layer;
a third semiconductor layer with a low impurity density provided on said second semiconductor layer, the electron affinity of said third semiconductor layer being smaller than that of said second semiconductor layer;
an undoped gallium arsenide layer provided on said third semiconductor layer;
a fourth semiconductor layer with a low impurity density provided on said undoped gallium arsenide layer, said fourth semiconductor layer having a first surface portion and a second surface portion, and having an electron affinity smaller than that of said undoped gallium arsenide layer;
a fifth semiconductor layer with a low impurity density provided on said second surface portion of said fourth semiconductor layer, an impurity density of said second semiconductor layer being higher than those of said first, third, fourth and fifth semiconductor layers;
a first control electrode provided on said first surface portion of said fourth semiconductor layer;
a first N-type high impurity density region and a second N-type high impurity density region provided respectively on both sides of said first control electrode, said first and second N-type high impurity density regions extending from said first surface portion of said fourth semiconductor layer and reaching said second semiconductor layer, impurity densities of said first and second N-type high impurity density regions being higher than those of said second, third and fourth semiconductor layers and said undoped gallium arsenide layer;
a first electrode and a second electrode respectively provided on said first N-type high impurity density region and on said second N-type high impurity density region;
a second control electrode provided on said fifth semiconductor layer;
a third N-type high impurity density region and a fourth N-type high impurity density region provided respectively on both sides of said second control electrode, said third and fourth N-type high impurity density regions extending from a surface of said fifth semiconductor layer, impurity densities of said third and fourth N-type high impurity density regions being higher than those of said second, third, fourth and fifth semiconductor layers and said undoped gallium arsenide layer; and
a third electrode and a fourth electrode respectively provided on said third N-type high impurity density region and on said fourth N-type high impurity density region.

48. A semiconductor device as recited in claim 47, further comprising means for connecting said second electrode and said third electrode.

49. A semiconductor device as recited in claim 47, wherein said impurity density of said second semiconductor layer is in the range of $5 \times 10^{17}$–$5 \times 10^{18}$ cm$^{-3}$, said impurity density of said third semiconductor layer is in the range of $1 \times 10^{13}$–$1 \times 10^{17}$ cm$^{-3}$, said impurity density of said fourth semiconductor layer is in the range of $1 \times 10^{13}$–$1 \times 10^{17}$ cm$^{-3}$ and said impurity density of said fifth semiconductor layer is in the range of $1 \times 10^{13}$–$1 \times 10^{17}$ cm$^{-3}$.

50. A semiconductor device as recited in claim 49, wherein a film thickness of said second semiconductor layer is in the range of 50–500 Å, a film thickness of said third semiconductor layer is in the range of 50–1000 Å, a film thickness of said undoped gallium arsenide layer is in the range of 10–500 Å, a film thickness of said fourth semiconductor layer is in the range of 50–500 Å, and a film thickness of said fifth semiconductor layer is in the range of 50–1000 Å.

51. A semiconductor device as recited in claim 50, wherein said first semiconductor layer is an undoped gallium arsenide layer, said second semiconductor layer is an N-type gallium arsenide layer, said third semiconductor layer is an undoped aluminum gallium arsenide layer, said fourth semiconductor layer is an undoped aluminum gallium arsenide layer, and said fifth semiconductor layer is an undoped gallium arsenide layer.

52. A semiconductor device comprising:
a substrate;
a first semiconductor layer with a low impurity density provided on said substrate;
a P-type second semiconductor layer with a high impurity density provided on said first semiconductor layer, said second semiconductor layer acting as a channel layer;
a third semiconductor layer with a low impurity density provided on said second semiconductor layer, the sum of the electron affinity and the energy gap of said third semiconductor layer being larger than that of said second semiconductor layer;
an undoped gallium arsenide layer provided on said third semiconductor layer, said undoped gallium arsenide layer having a first surface portion and a second surface portion;
a fourth semiconductor layer with a low impurity density provided on said second surface portion of said undoped gallium arsenide layer, an impurity density of said second semiconductor layer being higher than those of said first, third and fourth semiconductor layers;
a first control electrode provided on said first surface portion of said undoped gallium arsenide layer;
a first P-type high impurity density region and a second P-type high impurity density region provided respectively on both sides of said first control electrode, said first and second P-type high impurity density regions extending from said first surface portion of said undoped gallium arsenide layer and reaching said second semiconductor layer, impurity densities of said first and second P-type high impurity density regions being higher than those of said second and third semiconductor layers and said undoped gallium arsenide layer;

a first electrode and a second electrode respectively provided on said first P-type high impurity density region and on said second P-type high impurity density region;

a second control electrode provided on said fourth semiconductor layer;

a third P-type high impurity density region and a fourth P-type high impurity density region provided respectively on both sides of said second control electrode, said third and fourth P-type high impurity density regions extending from a surface of said fourth semiconductor layer and reaching said second semiconductor layer, impurity densities of said third and fourth P-type high impurity density regions being higher than those of said second, third and fourth semiconductor layers and said undoped gallium arsenide layer; and a third electrode and a fourth electrode respectively provided on said third P-type high impurity density region and on said fourth P-type high impurity density region.

53. A semiconductor device as recited in claim 52, further comprising means for connecting said second electrode and said third electrode.

54. A semiconductor device as recited in claim 53, further comprising a fifth semiconductor layer with a low impurity density provided between said fourth semiconductor layer and said second surface portion of said undoped gallium arsenide layer, an inpurity density of said fifth semiconductor layer being lower than that of said second semiconductor layer, an electron affinity of said fifth semiconductor layer being smaller than those of said fourth semiconductor layer and said undoped gallium arsenide layer, and said impurity densities of said third and fourth P-type high impurity density regions being higher than that of said fifth semiconductor layer.

55. A semiconductor device as claimed in claim 54, further comprising an undoped aluminum gallium arsenide layer provided between said fourth semiconductor layer and said second surface portion of said undoped gallium arsenide layer.

56. A semiconductor device as recited in claim 52, wherein said first semiconductor layer is an undoped gallium arsenide layer, said second semiconductor layer is a P-type Germanium layer, said third semiconductor layer is an undoped aluminum gallium arsenide layer, and said fourth semiconductor layer is an undoped gallium arsenide layer.

* * * * *